United States Patent
Maula et al.

(10) Patent No.: US 7,901,736 B2
(45) Date of Patent: Mar. 8, 2011

(54) MULTILAYER MATERIAL AND METHOD OF PREPARING SAME

(75) Inventors: Jarmo Maula, Espoo (FI); Kari Härkönen, Kauniainen (FI); Anguel Nikolov, Bridgewater, NJ (US)

(73) Assignee: Planar Systems Oy, Espoo (FI)

( * ) Notice: Subject to any disclaimer, the term of this patent is extended or adjusted under 35 U.S.C. 154(b) by 1030 days.

(21) Appl. No.: 11/305,024

(22) Filed: Dec. 19, 2005

(65) Prior Publication Data

US 2006/0134433 A1 Jun. 22, 2006

(30) Foreign Application Priority Data

Dec. 21, 2004 (FI) .................................... 20045495

(51) Int. Cl.
*C23C 16/00* (2006.01)

(52) U.S. Cl. ................... 427/248.1; 359/722; 359/589

(58) Field of Classification Search .................. None
See application file for complete search history.

(56) References Cited

U.S. PATENT DOCUMENTS

| | | | |
|---|---|---|---|
| 3,432,225 A | | 3/1969 | Rock |
| 3,675,619 A | * | 7/1972 | Burd .............................. 118/719 |
| 4,010,710 A | * | 3/1977 | Williams ...................... 118/730 |
| 4,235,650 A | * | 11/1980 | Chang et al. .................. 438/567 |
| 4,486,487 A | | 12/1984 | Skarp |
| 5,244,692 A | * | 9/1993 | Zagdoun et al. ........... 427/126.3 |
| 5,314,759 A | | 5/1994 | Harkonen et al. |
| 5,508,091 A | | 4/1996 | Austin |
| 5,597,609 A | * | 1/1997 | Beisswenger et al. ............. 427/8 |
| 6,266,193 B1 | | 7/2001 | Saif et al. |
| 6,388,378 B1 | | 5/2002 | Törnqvist et al. |
| 6,551,406 B2 | * | 4/2003 | Kilpi .............................. 118/728 |
| 6,570,253 B1 | * | 5/2003 | Lim et al. ...................... 257/758 |
| 6,576,053 B1 | * | 6/2003 | Kim et al. ........................ 117/89 |
| 6,660,660 B2 | * | 12/2003 | Haukka et al. ................ 438/778 |

(Continued)

FOREIGN PATENT DOCUMENTS

EP 0945526 A1 9/1999

(Continued)

OTHER PUBLICATIONS

Kosaku, JP2004-176081A, Jun. 2004—English machine translation.*

(Continued)

*Primary Examiner* — Timothy H Meeks
*Assistant Examiner* — Joseph Miller, Jr.
(74) *Attorney, Agent, or Firm* — Buchanan Ingersoll & Rooney PC

(57) ABSTRACT

The invention relates to a multilayer material deposited by ALD. A multi-layer structure of a high refractive index material is deposited on a substrate using ALD at a temperature below about 450° C. Advantageous results are obtained when a high refractive index material A is coated with another material B after a certain thickness of material A has been achieved. Thus, the B barrier layer stops the tendency for material A to crystallize. The amorphous structure gives rise to less optical loss. Further, the different stress nature of materials A and B may be utilized to achieve a final optical material with minimal stress. The thickness of each material B layer is less than that of the adjacent A layer(s). The total effective refractive index of the high refractive index material A+B being shall be greater than 2.20 at a wavelength of 600 nm. Titanium oxide and aluminium oxide are preferred A and B materials. The structure is useful for optical coatings.

16 Claims, 3 Drawing Sheets

U.S. PATENT DOCUMENTS

| | | | |
|---|---|---|---|
| 7,142,375 B2* | 11/2006 | Nikolov et al. | 359/722 |
| 7,294,360 B2* | 11/2007 | Maula et al. | 427/162 |
| 2001/0013607 A1* | 8/2001 | Miyasaka | 257/66 |
| 2001/0019566 A1* | 9/2001 | Jewell | 372/43 |
| 2001/0020586 A1* | 9/2001 | Kida et al. | 204/298.13 |
| 2001/0024387 A1* | 9/2001 | Raaijmakers et al. | 365/200 |
| 2002/0003593 A1* | 1/2002 | Arakawa et al. | 349/65 |
| 2002/0160194 A1* | 10/2002 | Phillips et al. | 428/403 |
| 2003/0021033 A9 | 1/2003 | Mitsuishi et al. | |
| 2003/0031793 A1* | 2/2003 | Chang et al. | 427/255.28 |
| 2004/0043260 A1 | 3/2004 | Nadaud et al. | |
| 2004/0121164 A1* | 6/2004 | Iacovangelo et al. | 428/432 |
| 2004/0197527 A1* | 10/2004 | Maula et al. | 428/172 |
| 2004/0258947 A1* | 12/2004 | Moelle et al. | 428/627 |
| 2005/0154161 A1* | 7/2005 | Schmitt et al. | 526/222 |

FOREIGN PATENT DOCUMENTS

| | | |
|---|---|---|
| EP | 0 980 850 A1 | 2/2000 |
| EP | 1 229 356 A2 | 8/2002 |
| JP | 2000-171607 A2 | 6/2000 |
| JP | 2004-176081 A * | 6/2004 |

OTHER PUBLICATIONS

USPTO translation of paragraph in Kosaku (JP2004-176081), paragraph [0024].*

Kattelus H. et al., "Layered Tantalum-Aluminum Oxide Films Deposited by Atomic Layer Epitaxy," Thin Solid Films, Elsevier-Sequoia S.A. Lausanne, CH LNKD-DOI:10.1016/0040-6090(93)90173-M, vol. 225, No. 1/02, Mar. 25, 1993, pp. 296-298 XP000358326 ISSN: 0040-6090.

Search Report dated May 10, 2010 issued in European Patent Publication No. 05387024.

* cited by examiner

MULTILAYER MATERIAL AND METHOD OF PREPARING SAME

BACKGROUND

1. Field

The invention relates to an ALD-deposited material, suitable for use in optical coatings. In particular, the invention relates to a material having alternating layers for providing a high refractive index and low optical loss, to a method for producing said material, and to the use thereof in optical structures.

2. Description of Related Art

Optical coatings are used in optical devices to provide various final properties. Such coatings include filters, antireflective coatings and reflectors. These coatings are typically composed of layers of different materials varying in both thickness and refractive properties, in order to produce the required spectral response. "Optical" in this context refers to electromagnetic wavelengths in the range 180 nm to 20 µm.

Optical losses (absorption and scattering loss), refractive index and film stress or tension are very important parameters in the field of thin film optical coatings. The absence of point defects, like metallic impurities, is also especially important for applications using laser light.

Additionally, most applications require high performance in environmental tests, demanding as small effects from humidity and temperature variations as possible. In the typical design case, optical losses should be as small as possible, and film layers with as high and as low refractive index as possible should be available. A coating design typically comprises more than one thin film material, and a plurality of layers. Complex optical coatings may contain several hundred alternating layers of high and low refractive index. The thickness of the layers also varies according to the required properties. Such optical structures are usually designed using dedicated computer programs.

Amorphous films typically cause less loss than crystalline films, in which various interaction effects occur, causing scattering and absorption. Optical losses in thin films containing crystals typically depend on the crystal size and on the light wavelength, so that less loss occurs at longer wavelengths than at shorter wavelengths. The importance of losses naturally depends on the application, but generally speaking low losses enable a wider range of designs or provide performance benefits.

Materials having a high refractive index are advantageous. The designs perform better, and the manufacturing of actual devices is typically easier and less costly, as the total film thickness is reduced.

Optical losses are often measured using a spectrophotometer. Due to optical interference, film transmission depends on the film thickness, but the effects of optical interference are not relevant at maximum transmission wavelengths, and the remaining transmission loss is caused by the film bulk properties like absorption and scattering. Comparison between various materials and structures is most easily done by measuring deposited films of various thicknesses and comparing the maximum transmission values. With crystalline film, optical losses are greater at short wavelengths. Thus for example, in the case of applications for human vision it is advantageous to measure losses at about 360 to 440 nm, near the sensitivity limit for the human eye.

In the production of a reliable optical product, low stress or tension in the structure is very important. The thicker a coating is, the more important it is to achieve low internal tension in order to avoid delamination or cracking of the film stack.

There are several methods for measuring stress. For example, if one side of a thin glass substrate is coated, tension causes bending of the substrate. The curvature can be measured, and the film stress calculated based on the known properties of the substrate material.

Molecules may diffuse in thin films, during and/or after the deposition, giving rise to various adverse effects. Ideally, thin film materials should be resistant against diffusion. Measurement of the barrier properties is case-dependent. In some cases, adverse effects occur during the deposition process due to incompatibility between chemicals in the film interface, causing increased loss or influence on crystal growth. Some materials may cause problems in the final optical component by causing delamination or added loss due to diffusion of material across the interface.

For the purpose of this text, "oxide" refers to all oxides (for example, titanium oxide, aluminium oxide, tantalum oxide) of various chemical composition, phase and crystalline structure. Correspondingly, where a stoichiometric chemical formula is used, as is common practice in the field, this does not necessarily imply that the layer in question has the corresponding absolute stoichiometric composition. The expression "index" refers to refractive index if not indicated otherwise.

Titanium oxide is known for its high refractive index. Titanium oxide appears in compounds of various compositions, e.g. $TiO_2$, $Ti_2O_3$ and $Ti_3O_5$. Three crystal forms appear: Rutile, brookite and anatase. Further, titanium oxide appears in an amorphous form. The properties depend on the crystal form. Phases may be mixed, amorphous and crystalline forms may coexist in the same film. Thus, the properties of different films show great variation owing to differences in the manufacturing process.

Unfortunately, using Atomic Layer Deposition (ALD) technology (see below), amorphous titanium oxide is readily generated only at below about 150° C. deposition temperature. This severely limits its usability in optical designs. A deposition temperature above about 150° C. results in crystalline titanium oxide, which gives rise to optical losses. On the other hand, higher deposition temperatures are desirable for example

- to enable the use of titanium oxide in thin film deposited structures together with other materials requiring higher deposition temperatures
- to increase titanium oxide film index and density
- to adjust the residual stress in titanium oxide film
- to increase the thin film adhesion to the substrate.

In addition to the problems related to the crystal structure, titanium oxide is known to be somewhat weak in holding oxygen. Other materials having an interface with titanium oxide may capture oxygen from the titanium oxide layer. In the case of titanium oxide, this leads to films with increased optical absorption.

In batch applications, growing $TiO_2$ film has a tendency to get influenced by surrounding surfaces. This appears as different film growth rate and possibly varying crystal structure of the $TiO_2$ film, depending on what is the opposing surface (distances less than about 15 . . . 20 mm seem to have an effect). If the surface has different structures and is parallel to the growing $TiO_2$ film surface, it causes effects like a "photograph" on the growing $TiO_2$ film. The origin of this effect is unknown at the moment. Especially pure $TiO_2$ film is very sensitive to effects from the surrounding space. This effect limits the possibility to use $TiO_2$ in batch ALD applications, because it sets limitations to the design of the cassette or other fixturing to hold substrates in place during the batch process.

Obviously, a material based on titanium oxide, but lacking the above-mentioned drawbacks of crystals, reactivity and sensitivity for the surrounding, would be very beneficial.

Atomic Layer Deposition (ALD), originally called Atomic Layer Epitaxy, is a thin film deposition process used for over 20 years. Recently, this technique has gained significant interest in the semiconductor and data storage industries. The films generated by this technique have exceptional characteristics, such as being pinhole free and possessing excellent uniformity and step coverage even in structures with a very high aspect ratio. The ALD technique is also well suited for precise tailoring of material compositions and very thin films (<1 nm).

To grow films by means of the ALD technique, substrates are placed in a reaction chamber, where process conditions, including temperature and pressure, are adjusted to meet the requirements of the process chemistry and the substrate materials. Typically, the temperature is in the range 20 to 600° C. and the pressure in the range 1 to 1000 Pascal. Once the substrate reaches a stable temperature and pressure, a first precursor vapor is directed over the substrates. Some of this vapor chemisorbs on the surface, resulting in a one monolayer thick film. In true ALD, the vapor will not attach to itself and this process is therefore self-limiting. A purge gas is introduced to remove any excess of the first vapor and any volatile reaction products. Subsequently, a second precursor vapor is introduced which reacts with the monolayer of the first chemisorbed vapor. Finally the purge gas is introduced again to remove any excess of the second vapor as well as any volatile reaction products. This completes one cycle. This procedure is repeated until the desired film thickness is achieved. A key to successful ALD growth is to have the correct precursor vapors alternately pulsed into the reaction chamber without overlap. Another prerequisite in the ALD process is that each starting material is available in sufficient concentration for thin film formation over the whole substrate surface area and no extensive precursor decomposition takes place.

The principles of ALD type processes have been presented e.g. by T. Suntola in the Handbook of Crystal Growth 3, Thin Films and Epitaxy, Part B: Growth Mechanisms and Dynamics, Chapter 14, Atomic Layer Epitaxy, pp. 601-663, Elsevier Science B.V. 1994. A summary of the ALD technique can be found in Mikko Ritala and Markku Leskelä, Atomic Layer Deposition, Handbook of Thin Film Materials, H. S. Nalwa, Ed., Academic Press, San Diego (2001), Vol. 1, Chapter 2.

Thin layers employing alternating layers of titanium oxide and aluminium oxide have been disclosed in U.S. Pat. No. 4,486,487 by Skarp. This patent explains the molecular $Al_2O_3$ barrier properties to protect $TiO_2$ against $AlCl_3$ at 500° C. It was estimated that 0.6 nm (6 Å) of $Al_2O_3$ eliminated the effects of $AlCl_3$.

Besides the optimization of insulating properties, this patent also discloses refractive index optimization of this $TiO_2/AlO_3$ combination film for use in an electroluminescent display structure.

In U.S. Pat. No. 5,314,759 to Härkönen, Härkönen and Törnqvist, a multilayer phosphor layer system for electroluminescent displays is disclosed. The use of a few atomic layers (<100 Å, 5 to 50 Å, preferably <10 Å) of $Al_2O_3$ and other oxides and mixed materials is disclosed as a matching layer to:

Match different crystal structures of the different layer materials on both sides of the matching layer.
Act as a chemical buffer layer to prevent chemical reactions and diffusion.
Equalize stresses caused by differences in the crystal lattice parameters and thermal expansion characteristics.

In the thesis of M. Ritala ("Atomic Layer Epitaxy growth of Titanium, Zirconium and Hafnium dioxide thin films", Helsinki, Finland 1994, ISBN 951-41-0755-1), it is mentioned that when $TiO_2$ films having a thickness below 200 nm were deposited on an amorphous substrate, the films were essentially amorphous while those deposited on crystalline substrates were more crystalline. Films deposited using alkoxides resulted in films possessing a more crystalline structure than those grown from $TiCl_4$. Ritala mentions unpublished work by Lindfors, where light scattering from $TiO_2$ films was effectively reduced by incorporating an intermediate $Al_2O_3$ layer a few nm thick into them. Incorporation of intermediate $Al_2O_3$ layers into $TiO_2$ films reduced the crystallinity. A test series of samples consisting 20 $TiO_2$-$Al_2O_3$ film pairs was prepared. The number of ALD cycles for $TiO_2$ between $Al_2O_3$ layers was between 900 and 990. The thickness of the $Al_2O_3$ layers was 10 to 100 ALD cycles. The deposition temperature was about 500° C., and the growth rate for both $Al_2O_3$ and $TiO_2$ was about 0.5 Å/ALD-cycle. $Al_2O_3$ was made using $AlCl_3$ and $H_2O$ as precursors. $TiO_2$ used $TiCl_4$ and $H_2O$ as precursors.

In Ritala's work, surface roughness was measured due to the concern that light scattering (loss) becomes stronger with increasing surface roughness. It is specifically mentioned that 10 cycles of $Al_2O_3$ layer had no significant effect on the surface morphology. Thicker $Al_2O_3$ layers progressively decreased the surface roughness. It was observed, that transmission increased (losses were reduced) by increasing the intermediate $Al_2O_3$ layer thickness until a saturation level was reached at about 75 cycles of $Al_2O_3$. This corresponded to about 30 . . . 40 Å.

In U.S. Pat. No. 6,388,378 by Törnqvist and Pitkänen, an insulative film for thin film structures is described. This patent describes an electrically insulating $TiO_2$ and $Al_2O_3$-containing film, optimized to resist cracking on alkali metal-free glass. It is pointed out that a high $TiO_2/Al_2O_3$ content causes cracking.

EP 1 229 356 (Dickey, Long, Törnqvist) is directed to methods and apparatus for the production of optical filters. The methods include alternating exposures of a surface of a substrate to two or more precursors that combine to form a sublayer on the surface. A measurement light flux is provided to measure an optical property of the sublayer or an assemblage of sublayers. Based on the measurement, the number of sublayers is selected to produce an optical filter, such as a Fabry-Perot filter, having predetermined properties.

According to Japanese patent application 200017607, vacuum evaporation and sputtering have been used to prepare optical coatings. However, in comparison to these, ALD films generated have exceptional characteristics, such as being pinhole free and possessing excellent uniformity and step coverage even in structures with a very high aspect ratio. The ALD technique is also better suited for precise tailoring of material compositions and very thin films, and is suited for cost-effective automated batch processing.

Multilayer structures made using ALD technology have been under active research and that work has resulted in several patents. However, over the past 10 years that work has been mainly devoted to semiconductor dielectrics for transistor gate oxide and memory cell applications. These publications describe various ways to increase electrical permittivity, decrease leakage current and increase breakdown strength and related lifespan, or reliability issues. The total thickness of films for use in the semiconductor field is very small compared with films used for optical applications, and typically the publications related to semiconductor applications do not deal with stress or optical properties.

SUMMARY

Disclosed herein is an ALD-deposited material and a process for manufacturing said material. In the course of our research directed to reducing optical losses in multi-layer film structures deposited by the ALD technology, it was observed that as a multi-layer structure of a high refractive index material is deposited on a substrate using ALD at a temperature below about 450° C., advantageous results are obtained when the high refractive index material (material A) is coated with another material (B) after a certain thickness of material A has been achieved. A material according to the invention thus comprises at least one layer of material A, and at least one layer of material B, materials A and B having at least one common interface. The thickness of each material A layer is in the range about 2 nm to about 100 nm, the thickness of each material B layer being less than that of the adjacent A layer(s). The total effective refractive index of the high refractive index material A+B being shall be greater than 2.20 at a wavelength of 600 nm. The ALD method disclosed herein comprises the following carried out at a deposition temperature of less than 450° C.:

a) depositing a layer of material A to a thickness of about 2 ... 100 nm,
b) depositing a layer of material B to a thickness less than that of the A layer,
c) if desired, repeating steps a) and b) until a material of desired total thickness is obtained, to produce a material, the total effective refractive index of which is greater than 2.20 at a wavelength of 600 nm.

DETAILED DESCRIPTION

Figure 1:
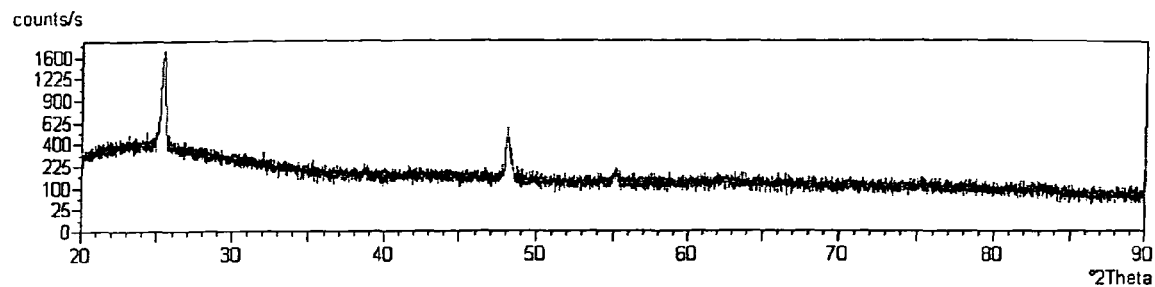
FIG. 1 shows the XRD (X-ray diffraction) result of Example 1, (500*AlO+7000*TiO) at a temperature about 285° C. This represents the anatase crystalline form of titanium oxide.

In a material disclosed herein, the layer of material B acts as a barrier layer, which in this context means that layer B prevents chemical and physical adverse effects that layer A otherwise would have with a superimposed layer, either during the deposition process or later in the finished optical structure. Thus, a B layer may inhibit the tendency of an A layer to crystallise, which would occur as the A layer grows in thickness. Crystallinity in an optical structure leads to losses.

A layered structure having such alternating layers of A (of high refractive index) and B, yields advantageous optical and mechanical properties, and may be used in optical coatings. In the final optical structure, material N*(A+B) may be represented as a single high index material, as long as the wavelength of the electromagnetic radiation is sufficiently larger than the thickness of either material A and B. The total effective refractive index of the total layer structure N*(A+B) shall be greater than 2.20 at wavelength 600 nm. Preferably, it is greater than 2.25; more preferably greater than 2.30; even more preferably greater than 2.35. According to the certain embodiments disclosed herein, the deposition process is carried out at a temperature not higher than about 450° C., preferably from about 200° C. to about 350° C.

A preferred material for material A is titanium oxide, which is very suitable for optical purposes due to its very high refractive index. Other possible A materials are tantalum oxide, niobium oxide, hafnium oxide, zirconium oxide and sulphides, for example zinc sulphide.

Preferably, the barrier material (B layer) is aluminium oxide. Other barrier layer materials are e.g. silicon oxide, lanthanide oxides, tantalum oxide, niobium oxide, hafnium oxide, zirconium oxide and combinations of these. B layers of different materials or combinations may also occur in the same optical layer structure. A B layer may also include material occurring as an A layer material.

Advantageously, the structure comprising A and B material layers may be combined with a material C, the refractive index of which is less than that of A+B. Such combinations can advantageously be used when manufacturing optical coatings. Examples of preferable materials for material C are silicon oxide, aluminium oxide, mixtures or combinations of these. Also fluorides are potential materials. Preferably, the refractive index of the C material is less than 1.8.

Further, an intermediate B layer makes possible the buildup, on top of an A layer, of a C layer (as explained in the introduction, optical films use high and low index films and C may perform the function of low index film) which would otherwise react chemically with the A layer at the A-C interface.

An example is titanium oxide, which reacts with trimethylaluminium (TMA). A B layer of aluminium oxide deposited with aluminium chloride as a precursor makes the deposition of films using TMA precursor possible without reactions causing optical losses. TMA is a very common precursor in ALD technology for the deposition of several films including $Al_2O_3$ and $SiO_2$:Al.

$Al_2O_3$ film can be deposited using $AlCl_3$ or TMA precursors, but the resulting film is more uniform in its optical properties when TMA is used. Thus, an $Al_2O_3$ barrier layer made by using $AlCl_3$ has value also when depositing $Al_2O_3$ on top of the barrier by using TMA precursor.

According to an embodiment disclosed herein, a multi-layer ALD-deposited material as defined above is prepared whereby material B comprises the same chemical entity as material A, but is made by using a precursor different from that used for depositing A.

Ideally, the layer B should be as thin as possible and its index should be high. Additionally there should be no adverse effects between layer A material and layer B during deposition and later in the finished film stack.

The use of amorphous material for the film B is a reliable way of achieving the desired barrier effect in many circumstances. Examples of materials being amorphous over a large temperature range are aluminium, lanthanide, niobium and tantalum oxides. It may be possible to apply crystalline materials for B as well, but a crystalline layer A easily interacts with a crystalline layer B, easily causing more demands for the actual deposition process.

An important parameter for an embodiment of the high index material disclosed herein is the thickness of the material A layer. A too thick A layer causes losses due to growth of crystals, and a thin A layer indirectly increases the content of material B, which may decrease index. Additionally, the stress of the resulting film depends on the thickness of the layer A.

Figure 8:
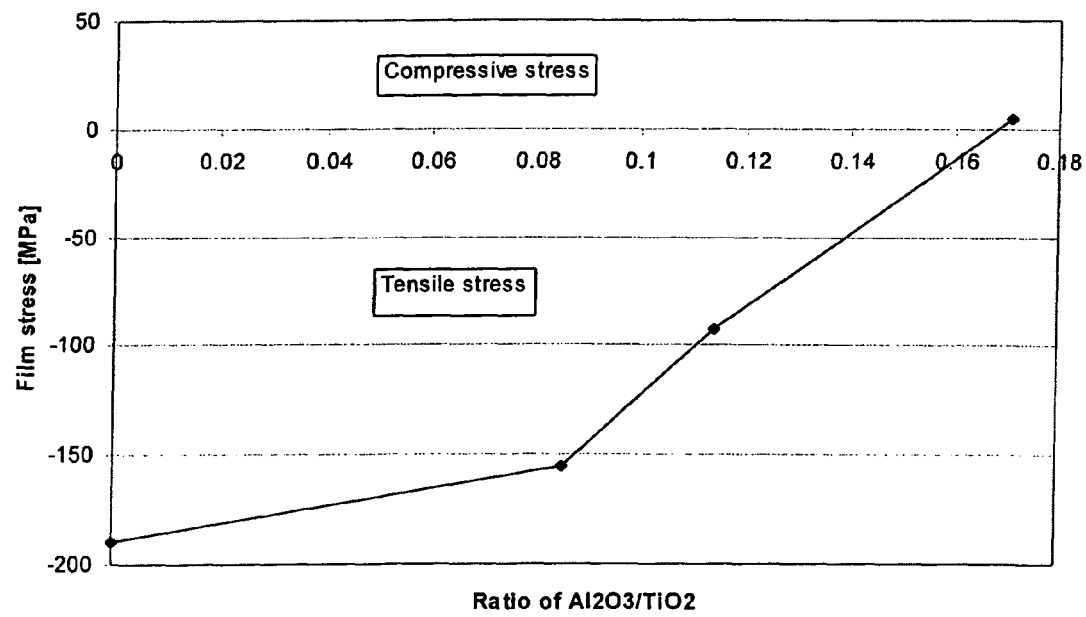
FIG. 8 shows the dependence of the thin film stress on the ratio of aluminium oxide to titanium oxide.

Normally, low tensile or compressive film stress is required for structurally and optically reliable films. According to an disclosed herein, the different stress nature of materials A and B is utilized to achieve a final optical material with minimal stress. For example, if only an atomic layer of titanium oxide is deposited at 285° C., it will develop tensile stress (the film shrinks and makes the substrate concave) of approximately 190 MPa. An aluminium oxide atomic layer deposited at the same temperature develops compressive stress (the film deforms the substrate by making it convex) with an absolute value of about 65 MPa. An A+B material made of titanium oxide and aluminium oxide can be deposited with practically no stress by optimal selection of the thickness of materials A and B. FIG. 8 shows measured stress for A+B material developed for different ratios of aluminium oxide to titanium oxide. The structure and deposition conditions for the materials are described in the examples below.

In some applications, intentional stress in the high index film of material A+B can be used to compensate stress of a low index material C film in the final optical structure.

In principle, a process described herein is possible in all ALD reactors having a source system to deliver all required chemicals to the substrates under the required temperature and pressure conditions. Preferably, to reduce production cost, the deposition process is a batch process, in which several substrates or items are coated simultaneously. Depending on the application, the number of substrates may be counted in thousands. In a batch ALD process, the substrates may be essentially planar objects, whereby the surfaces may be arranged in a vertical, horizontal or tilted orientation. From a deposition point of view, the substrates may be single-sided, have two open sides, or be arranged pair-wise back to back having one open side per substrate, or in a face-to face orientation; or combinations of the above. Further possible substrates include items having a three-dimensional structure, macroscopic or microscopic such as surfaces comprising micro-optical elements, diffractive optical elements or other three-dimensional parts.

Advantageously, the distance between substrates in a batch is not more than about 8 mm. Preferably the substrates are coated on at least two sides, an example being both surfaces of a lens. It is advantageous to support the substrates on shelve structures having openings smaller than the substrates themselves, preferably only slightly smaller, whereby the greater part of the top and bottom surfaces are free for coating.

Below, several possible precursors are listed for the deposition of titanium oxide in an ALD process.

Titanium halides, e.g.:
   Titanium (IV) chloride, $TiCl_4$
   Titanium (IV) bromide, $TiBr_4$
   Titanium (IV) iodide, $TiI_4$
Titanium alkoxides, e.g.:
   Titanium (IV) ethoxide, $Ti[OC_2H_5]_4$
   Titanium (IV) i-propoxide, $Ti[OCH(CH_3)_2]_4$
   Titanium (IV) t-butoxide, $Ti[OC_4H_9]_4$ Titanium amides, e.g.:
   Tetrakis(dimethylamino)titanium, $Ti[N(CH_3)_2]_4$
   Tetrakis(diethylamino)titanium, $Ti[N(C_2H_5)_2]_4$
   Tetrakis(ethylmethylamino)titanium, $Ti[N(C_2H_5)(CH_3)]_4$
Titanium acetamidinates Additionally, several organometallic titanium compounds exist which are suitable as precursors.

$TiCl_4$ is the preferred choice, because of its low cost and availability from several vendors. Useful precursors for oxygen include water, oxygen, ozone and alcohols. Examples of useful silicon precursors for silicon oxide or for mixtures of silicon oxide and aluminium oxide are tris(tert-butoxy)silanol and tetrabutoxysilane.

The crystal structure of titanium oxide is very sensitive to the substrate surface conditions. This may cause restrictions on using $TiO_2$ as a first layer material over the substrate. However, with suitable substrate materials $TiO_2$ can also be used as a first layer over the substrate, and this may be preferable in certain optical applications.

According to a preferable embodiment disclosed herein, titanium oxide is used for A, and the thickness of the material A layers are 2 to 100 nm. Preferably, the titanium oxide layers are produced by 90 to 250 ALD cycles, and more preferably by 110 to 180 ALD cycles. The thickness of an aluminium oxide barrier (B) layer is less than that of the adjacent A layer or layers, and is typically produced by 1 to 10 ALD cycles. More preferably, the barrier layers are produced by 5 to 9 ALD cycles.

According to an embodiment disclosed herein, the thickness of each A layer is in the range 2 to 20 nm; preferably in the range 3 to 8 nm.

According to an embodiment disclosed herein, the thickness of each B layer is in the range 0.1 to 1.5 nm; preferably, in the range 0.3 to 1 nm.

Aluminium oxide layers in ALD are conventionally produced using trimethylaluminium (TMA) and water as precursors. However, TMA is unsuitable for the initial deposition cycles of an aluminium oxide barrier layer on titanium oxide. TMA reacts with titanium oxide if molecular contact is allowed. This leads to low transmission in the resulting layer structure. Instead, aluminium chloride is the preferable precursor for the initial cycles of aluminium oxide on titanium oxide. An initial sequence of 8 cycles is sufficient. The subsequent cycles may be carried out using trimethylaluminium as desired. The trimethylaluminium may be used together with other precursors, for example silicon-containing chemicals, to yield a layer (a C layer as defined above) having properties different from those of $Al_2O_3$.

Conventionally, the substrate is glass, but generally speaking all substrate materials permitting the required deposition temperature are possible to use. ALD is especially beneficial for substrates having a three-dimensional structure, or substrates having a surface with three-dimensional properties.

A preferred deposition process involves placing a substrate into a reaction space, introducing an inert gas into the reaction space, heating the reaction space to the desired temperature, and adjusting the pressure of the reaction space to the desired temperature. The reaction space is preferably operated at a reduced pressure, preferably between about 1 Pa and about 500 Pa. According to an embodiment disclosed herein, the deposition process is performed at a temperature below 450° C., preferably between about 200° C. and about 450° C., or, more preferably, between about 250° C. and about 320° C.

Next, a cycle for forming a single layer of the ALD film proceeds as follows. A chemical containing titanium is introduced into the reaction space. A portion of the titanium-containing chemical adsorbs onto at least one surface of the substrate and thereby forms an adsorbed layer on the substrate surface. The reaction space is then purged with an inert purging gas to remove most of the excess (not surface-bound) titanium-containing chemical and any adsorption by-products. Next, a chemical containing oxygen is introduced into the reaction space. A portion of the oxygen-containing chemical reacts with the adsorbed layer and forms a titanium oxide film. The reaction space is purged again with an inert purging gas to remove the excess chemical containing oxygen and any reaction by-products. This sequence may be repeated N times, where N describes an integer number of cycles, until sufficient layers are formed to yield a titanium oxide film having the desired thickness. Alternatively, a cycle may involve reversing the steps such that the chemical containing oxygen is introduced, followed by a first purge with a purging gas, and then the chemical containing titanium is introduced, followed by a second purge with a purging gas.

The expression TiO is used to describe a cycle to produce compounds containing titanium and oxygen, and the expression AlO to describe a cycle to produce compounds containing aluminium and oxygen.

In a preferable embodiment, a material described herein comprises titanium oxide in essentially amorphous form.

The growth rate (thickness increase per cycle) of A and B depends on many variables, including the specific source chemicals used. Typical growth rates range between about 0.01 nm and about 0.15 nm per cycle. Thus, performing 100 cycles produces films having a thickness ranging from about 1 nm to about 15 nm.

It is noted that a single cycle may deposit less than a monolayer of the film because the physical size of either chemical molecule may prevent full (100%) adsorption. Multiple cycles may be needed to form a monolayer of the film.

The materials and methods disclosed herein are illustrated by the following examples, which are not intended to limit the scope of the appended claims.

EXAMPLES

Development work was carried out using the deposition tool Planar Systems P400 ALD reactor (commercially available from Planar Systems Oy, Espoo, Finland).

This ALD reactor included a batch cassette with 23 shelves. The distance between shelves was about 8 mm from surface to surface.

A rectangular 195 mm×265 mm×1.1 mm glass substrate (OA-2, NEG) and round 100 mm glass wafer substrate (S-BSL7, OHARA) were loaded onto the middle shelves of the cassette situated in the reaction space of an ALD reactor. Silicon wafer was positioned on the top of the round glass substrate in order to expose only one side of the glass substrate surface to the gas flow. The rectangular substrate was placed on the holder to expose both surfaces to gas flow. After loading the substrates into the reactor, the reaction space was pumped down and purged with $N_2$ gas (99.999% purity, AGA Oy). The $N_2$ gas flow rate was adjusted to 3 SLM (standard litres per minute) in order to maintain a pressure of about 100 Pa inside the reaction space. The heated reaction space was allowed to stabilize for 12 hours, during which time the reaction space and substrates reached a temperature of about 285° C.

Rectangular substrate was used for X-ray diffraction (XRD) measurements.

S-BSL7 substrate was used for transmission measurements; measurements were taken also from the uncoated substrate. A Perkin-Elmer Lambda 900 instrument was used.

Material stress analysis was performed on the S-BSL7 glass wafers using a MESA LD system (Zygo Corporation).

Titanium oxide was selected as high index material A.

To reduce effects of the substrate surface finish to $TiO_2$ film, a thin $Al_2O_3$ layer (500*AlO, thickness about 50 nm) was deposited separately in each example process just before making the test deposition for the high index film. This deposition used the following chemicals: water and TMA (99.9% purity, Crompton). The pulse lengths were as follows:

| Pulse Sources | Length of Pulse (seconds) |
| --- | --- |
| Water | 0.75 |
| $N_2$-purge | 2.0 |
| TMA | 1.0 |
| $N_2$-purge | 2.0 |

In this work the following ALD process precursors were used:

Titanium oxide was made using $TiCl_4$ (99.9% purity, Aldrich) and water

Aluminium oxide was made by using $AlCl_3$ (granular, 1 . . . 10 mm, Merck 8.19178.0000) and water It was determined, that 117 cycles of $TiO_2$ provides very low stress. 321 cycles of $TiO_2$ provided tensile stress, which may cause problems in thicker applications.

Example 1

7000*TiO

Alternating pulses of titanium tetrachloride ($TiCl_4$), the transition metal chemical and transition metal source, and water, the oxygen-containing chemical, were vaporized from external source vessels and introduced into the reaction space such that they sequentially contacted the non-protected surfaces of the substrates (and walls of the reaction space). Between pulses, the reaction space was purged with $N_2$ gas. Thus the pulsing cycle was as follows: a water pulse followed by an $N_2$-purge followed by a $TiCl_4$ pulse followed by an $N_2$-purge. This cycle was repeated 7000 times. The pulse lengths were as follows:

| Pulse Sources | Length of Pulse (seconds) |
| --- | --- |
| Water | 1.0 |
| $N_2$-purge | 2.0 |
| $TiCl_4$ | 0.4 |
| $N_2$-purge | 2.0 |

After the 7000 cycles were complete, the substrates were removed from the reaction space and allowed to cool to room temperature. A titanium oxide film having a physical thickness of approximately 290 nm was present on all substrates. The titanium oxide film completely covered the exposed surfaces of the glass substrates while the non-exposed surfaces had only traces of a titanium oxide film near the edges.

As shown in FIG. 1, XRD patterns for the titanium oxide film on the glass substrate showed clear crystallinity.

Figure 2:
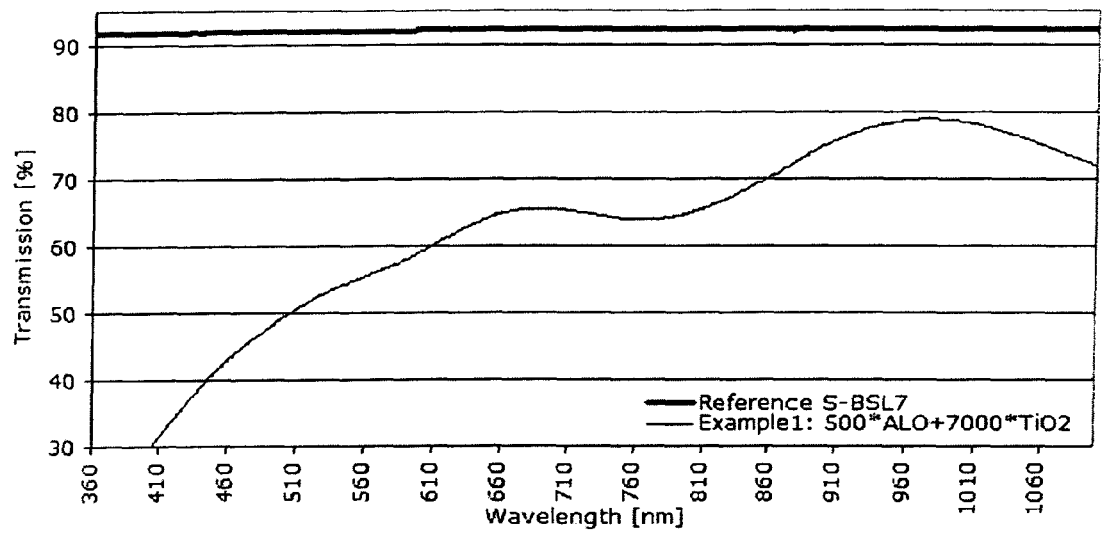
FIG. 2. shows the optical losses caused by crystals in the pure film (500*AlO+7000*TiO) of FIG. 1.

As shown in FIG. 2, optical losses are high due to low transmission, caused by crystalline film. This film developed stress with a value of about 190 Mpa.

Similar processes (Examples 2 and 3) were carried out using 234 and 117 TiO cycles between thin $Al_2O_3$ layers. One process was made at higher temperature to demonstrate temperature sensitivity. In addition, example 5 was carried out to provide a demonstration of low film loss by not introducing the initial Al$_2$O$_3$ layer.

Example 2

30*(234*TiO+8*AlO) deposited at a temperature about 285° C. produced a high index material film with a thickness of 350 nm.

Figure 3:
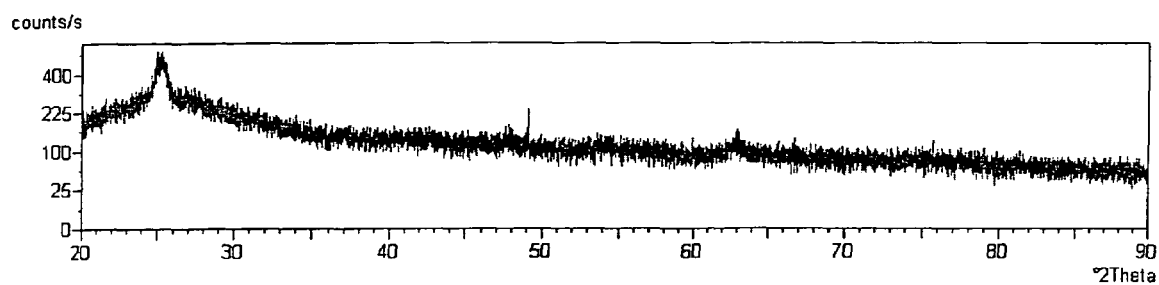
FIG. 3 shows the XRD result of Example 2, 30*(234*TiO+8*AlO) at a temperature about 285° C. Some crystallinity remains, however crystallinity is reduced compared to FIG. 1.
Figure 6:
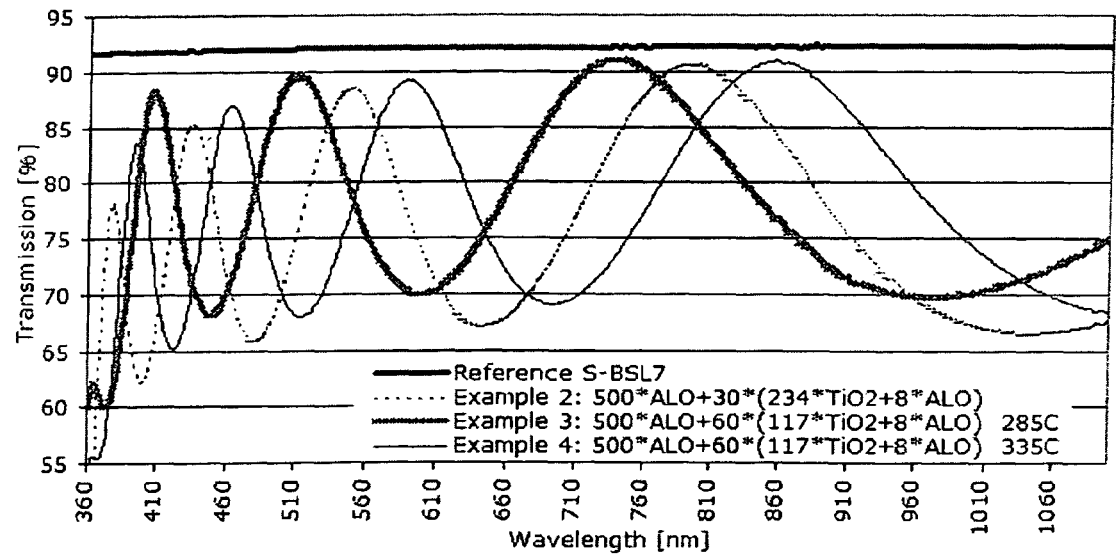
FIG. 6 illustrates transmission losses with various structures. Clearly, film without crystalline structure causes the lowest losses. Note that the about 50 nm of $Al_2O_3$ deposited on the substrate underneath each test structure causes loss due to interference. See FIG. 7 for film without $Al_2O_3$.

As shown in FIG. 3, XRD patterns for this film on the glass substrate still exhibited crystalline structure with some optical losses (see FIG. 6).

This film developed tensile stress with a value of about 156 Mpa.

Example 3

60*(1 17*TiO+8*AlO) deposited at a temperature about 285° C. produced a high index material with a physical thickness of 337 nm.

Figure 4:
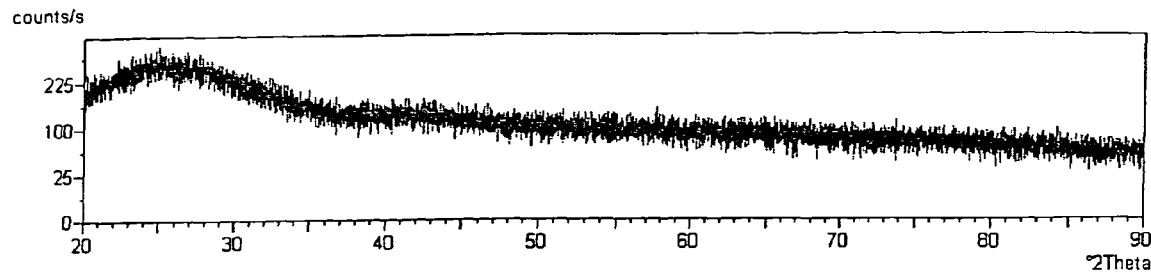
FIG. 4 shows the XRD result of Example 3, 60*(117*TiO+8*AlO) at a temperature about 285° C. No crystals are visible.

As shown in FIG. 4, XRD patterns for the this film on the glass substrate showed no crystallinity and optical losses were very small (see FIG. 6)

This film developed tensile stress with a value of about 66 Mpa.

Example 4

60*(117*TiO+8*AlO) deposited at temperature about 335° C. produced a high index material with a physical thickness of 390 nm.

Figure 5:
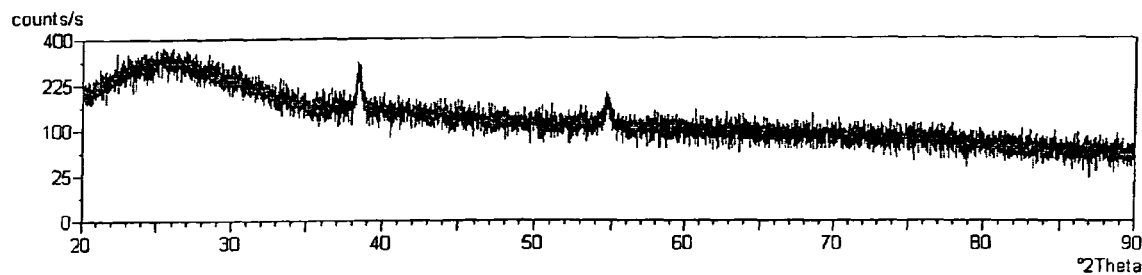
FIG. 5 shows the XRD result of Example 4, 60*(117*TiO+8*AlO) at a temperature about 335° C. Another crystalline form of titanium oxide appears due to increased temperature.

As shown in FIG. 5, XRD patterns for this film deposited on the glass substrate at a somewhat higher temperature demonstrated crystallinity, and some optical losses appear (see FIG. 6). This film developed tensile stress with a value of about 305 Mpa.

Example 5

Figure 7:
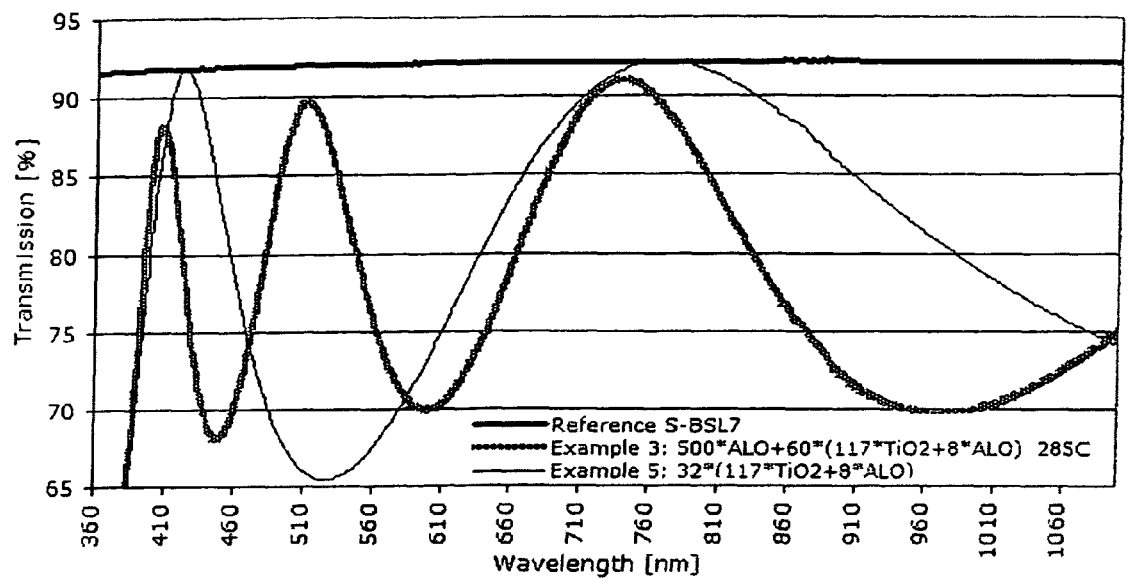
FIG. 7. Film without underlying $Al_2O_3$ film reveals film with very low optical loss.

32*(117*TiO+8*AlO) deposited at temperature about 285° C. produced a high index material with a physical thickness of 168 nm. To remove effects of the underlying Al$_2$O$_3$, Example 3 was repeated without the Al$_2$O$_3$. Optical losses were very small (see FIG. 7). The purpose of this test was to demonstrate directly the low optical loss nature of the deposited film, without utilizing mathematical treatment to eliminate the effect of the Al$_2$O$_3$ in the previous examples.

This film developed tensile stress with a value of <5 Mpa.

Without specific optimisation of the process, the thickness values in all examples were relatively uniform, showing a non-uniformity of less than 10% over the exposed glass plate substrate area.

It will be obvious to those having skill in the art that many changes may be made to the details of the above-described embodiments and examples without departing from the underlying principles of the invention. The scope of the present invention should, therefore, be determined only by the following claims.

The invention claimed is:

1. An Atomic Layer Deposition (ALD) method of manufacturing a material, said material comprising at least one layer of a first material (A), and at least one layer of a second material (B), materials A and B having at least one common interface, comprising carrying out the following at a deposition temperature of more than 150° C. and less than 450° C.:
    a) depositing by ALD a layer of material A comprising titanium oxide to a thickness of 2 to about 8 nm,
    b) depositing by ALD a layer of material B, selected from the group consisting of aluminium oxide, silicon oxide, and mixtures of these, to a thickness of 0.1 to 1.5 nm, using precursors selected from the group consisting of aluminium chloride, tris(tert-butoxy)silanol and tetrabutoxy silane, and
    c) repeating a) and b) at least once until a material of desired total thickness is obtained,
    to produce a material, the total effective refractive index of which is greater than 2.20 at a wavelength of 600 nm.

2. A method according to claim 1, wherein titanium chloride is used as a precursor of material A.

3. A method according to claim 1, wherein titanium ethoxide alone or in combination with titanium chloride is used as a precursor of material A.

4. A method according to claim 1, wherein material B is aluminium oxide.

5. A method according to claim 1, wherein material B is silicon oxide.

6. A method according to claim 1, further comprising the step of depositing one or more layers of a material C, the refractive index of which is less than the refractive index of A+B.

7. A method according to claim 6, wherein material C is selected from at least one of silicon oxide, aluminium oxide, or combinations of these.

8. A method according to claim 7, further comprising depositing on top of a B layer a layer C comprising aluminium oxide using aluminium chloride as a precursor.

9. A method according to claim 7, further comprising depositing on top of a B layer a layer C comprising aluminium oxide using trimethylaluminium as a precursor.

10. A method according to claim 7, further comprising depositing on top of a B layer a layer C comprising silicon oxide using tris(tert-butoxy)silanol as a precursor.

11. A method according to claim 7, further comprising depositing on top of a B layer a layer C comprising silicon oxide using tetrabutoxysilane as a precursor.

12. A method according to claim 1, wherein a batch ALD process is utilized.

13. A method according to claim 12, wherein the batch is placed with a distance between substrates of not more than about 8 mm, and the substrates are coated on at least two sides.

14. A method according to claim 12, wherein the batch is placed with a distance between substrates of not more than about 8 mm, and the substrates are placed back to back.

15. A method according to claim 12, wherein the substrates are placed on shelves having openings of less than the size of the substrates.

16. The method according to claim 1, wherein the deposition temperature is from about 200° C. to about 450° C.

* * * * *